United States Patent [19]

Iga et al.

[11] Patent Number: 5,020,066
[45] Date of Patent: May 28, 1991

[54] SURFACE-EMITTING-TYPE SEMICONDUCTOR LASER DEVICE

[75] Inventors: Kenichi Iga, Machida; Akira Ibaraki, Hirakata; Kenji Kawashima, Moriguchi; Kotaro Furusawa, Higashiosaka; Toru Ishikawa, Takatsuki, all of Japan

[73] Assignees: Development Corporation of Japan; Tokyo Institute of Technology, both of Tokyo; Sanyo Electric Electric Co., Ltd., Osaka, all of Japan

[21] Appl. No.: 457,256

[22] Filed: Dec. 27, 1989

[30] Foreign Application Priority Data

Dec. 28, 1988 [JP] Japan .................. 63-332067

[51] Int. Cl.⁵ .............................. H01S 3/19
[52] U.S. Cl. .................. 372/45; 372/46; 372/48; 372/49; 357/17
[58] Field of Search ............ 372/45, 46, 44, 43, 372/48, 49, 96; 357/4, 17

[56] References Cited

U.S. PATENT DOCUMENTS 4,309,670 1/1982 Burnham et al. ............... 372/46
4,599,729 7/1986 Sasaki et al. ................... 372/49

OTHER PUBLICATIONS

Sakaguchi et al., "Vertical Cavity Surface Emitting Laser with an AlGaAs/AlAs Bragg Reflector", Electronics Letters, Jul. 21, 1988, vol. 24, No. 15, pp. 928-929.

Iga et al., "Room Temperature Pulsed Oscillation of GaAlAs/GaAs Surface Emitting Junction Laser", IEEE Journal Quantum Electronics, vol. Q E-21, No. 6 Jun. 1985, pp. 663-668.

*Primary Examiner*—Georgia Epps
*Attorney, Agent, or Firm*—Darby & Darby

[57] ABSTRACT

A surface-emitting-type semiconductor laser device having a buried structure wherein a burying part having a current blocking function is formed around a buried part comprising an active region. A reflecting mirror consisting of a semiconductor multilayer film is installed on the buried part and the burying part, and the Bragg wavelength of this semiconductor multilayer film is set in matching with a longitudinal mode one mode higher than the longitudinal mode of oscillation in pulse operation. This semiconductor multilayer film has a configuration wherein two kinds of GaAlAs layers having different composition ratios of Al are laminated alternately, and the layer thickness of each GaAlAS layer constituting the semiconductor multilayer film is set so as to able to realize the Bragg wavelength calculated theoretically.

20 Claims, 2 Drawing Sheets

SURFACE-EMITTING-TYPE SEMICONDUCTOR LASER DEVICE

BACKGROUND OF THE INVENTION

1. Field of the Invention

The present invention relates to a surface-emitting-type semiconductor laser device having a buried structure.

2. Description of Related Art

Generally, the surface-emitting-type semiconductor laser device having a buried structure has a configuration wherein a buried part having a double heterostructure consisting of a cladding layer, an active layer, a cladding layer and a cap layer and a burying part which is located around this buried part and has a current blocking function are formed on a semiconductor substrate. Then, it provides a dielectric multilayer film, for example, a $TiO_2/SiO_2$ film as a reflecting mirror on the surface of the buried part.

Then, in such a laser device, since the reflecting mirror is formed by a dielectric multilayer film, the heat conductivity is poor, and the heat discharge from the buried part to a heat sink installed in contact with the dielectric multilayer film is insufficient. Also, the size of the reflecting mirror itself is limited due to the arrangement of current injection to the buried part, and a reduction in the reflecting area is inevitable. Furthermore, there has been the problem that since the reflecting mirror is not electrically conductive, an electrode has to be formed at a position separate from the reflecting mirror, and the manufacturing process is complicated, and the efficiency of current injection is poor.

Then, a surface-emitting-type semiconductor laser device has been developed which uses a semiconductor multilayer film electrically conductive as a reflecting mirror. Such a laser device has advantages as described below. Since the semiconductor multilayer film excels in heat conductivity, the efficiency of heat discharge from the buried part to the heat sink is high. Also, since the semiconductor multilayer film is electrically conductive, it can have an additional function as a carrier injecting part into the buried part, and the efficiency of current injection is improved. Furthermore, since the semiconductor multilayer film is electrically conductive, the size of the reflecting mirror can be set arbitrarily, and a sufficient reflecting area can be obtained.

However, the design of the semiconductor multilayer film constituting the reflecting mirror has not been investigated sufficiently, and the surface-emitting-type semiconductor laser device wherein the reflecting mirror is constituted with the semiconductor multilayer film cannot make a stable laser oscillation yet.

SUMMARY OF THE INVENTION

The present invention has been achieved based on the above-mentioned circumstances. In the surface-emitting-type semiconductor laser device of the present invention, a reflecting mirror consisting of a semiconductor multilayer film is installed on the buried part and the burying part, and in view of a shift of wavelength when heat is generated, the Bragg wavelength of this semiconductor multilayer film is set in matching with a longitudinal mode one mode higher than the longitudinal mode of oscillation in pulse operation. This semiconductor multilayer film has a configuration wherein, for example, two kinds of GaAlAs layers having different composition ratios of Al are laminated alternately plural times, and the layer thickness of each GaAlAs layer is set in matching with the Bragg wavelength calculated theoretically.

Also, the other reflecting mirror consisting of a dielectric multilayer film is installed at a position opposite to this semiconductor multilayer film, and the Bragg wavelength of this dielectric multi-layer film is also set in matching with a longitudinal mode one mode higher than the longitudinal mode of oscillation in pulse operation.

An object of the present invention is to provide a surface-emitting-type semiconductor laser device which can make a stable oscillation of laser beam.

Another object of the present invention is to provide a surface-emitting-type semiconductor laser device which can reduce the heat resistance by increasing heat discharge, and has a high efficiency of current injection.

Still another object of the present invention is to provide a surface-emitting-type semiconductor laser device wherein a buffer layer is installed between the buried part and the burying part, and the semiconductor multilayer film, and thereby deviations of the heights of the buried part and the burying part are corrected, and a crystalline disorder in the semiconductor multilayer film does not take place.

The above and further objects and features of the invention will more fully be apparent from the following detailed description with accompanying drawings.

DESCRIPTION OF THE PREFERRED EMBODIMENTS

Figure 1:
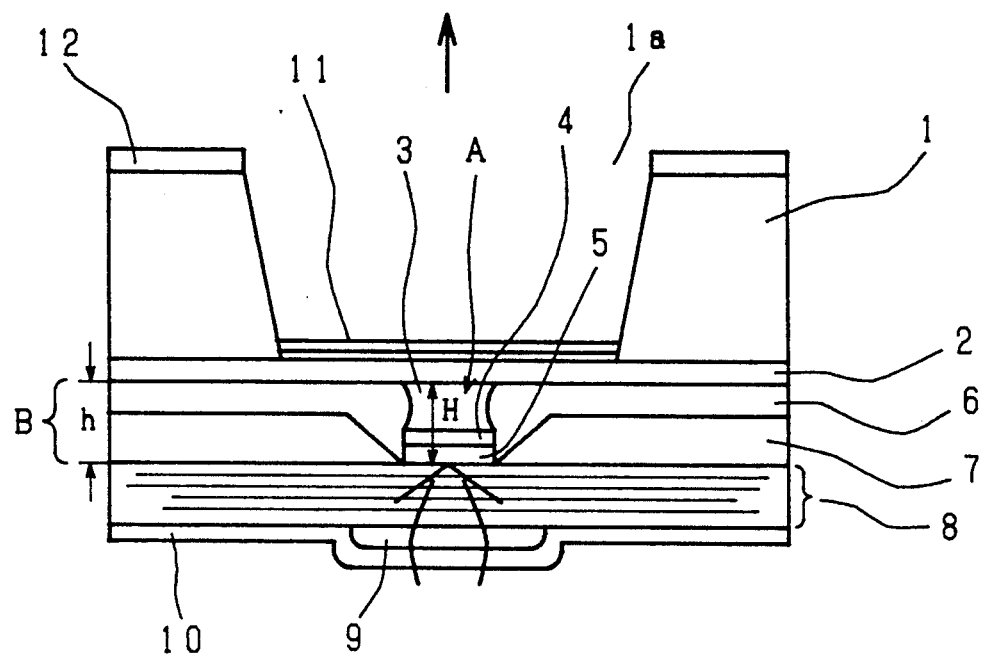
FIG. 1 is a cross-sectional structure view of an embodiment of a surface-emitting-type semiconductor laser device of the present invention.

FIG. 1 is a cross-sectional structure view of a surface-emitting-type semiconductor laser device in accordance with the present invention, and in FIG. 1, numeral 1 designates a semiconductor substrate made of GaAs the conductivity type of which is n-type. A cladding layer 2 the conductivity type of which is n-type (composition: $Ga_{0.65}Al_{0.35}As$, carrier density: $5 \times 10^{17}$ cm$^{-3}$, thickness: 3.0 μm), an active layer 3 the conductivity type of which is p-type (GaAs, $7 \times 10^{17}$ cm$^{-3}$, 2.0 μm), a cladding layer 4 the conductivity type of which is p-type ($Ga_{0.65}Al_{0.35}As$, $2 \times 10^{18}$ cm$^{-3}$, 0.5 μm) and a cap layer 5 the conductivity type of which is p-type ($Ga_{0.94}Al_{0.06}As$, $2 \times 10^{18}$ cm$^{-3}$, 0.5 μm) are grown in this sequence on the surface (the bottom surface in FIG. 1) of this semiconductor substrate 1, for example, by an organometalic vapor phase epitaxy method (OMVPE method), and thereafter by removing part of this double heterostructure deep to near the surface of the cladding layer 2, a buried part A is formed on the semiconductor substrate 1. On the cladding layer 2 around the buried part A, a burying part B having a current blocking function by means of p-n reverse bias is formed wherein a blocking layer 6 the conductivity type of which is p-type (composition: $Ga_{0.55}Al_{0.45}As$, carrier density: $5$–$7 \times 10^{17}$ cm$^{-3}$, film thickness: 1.0 μm) and a blocking layer 7 the conductivity type of which is n-type ($Ga_{0.70}Al_{0.30}As$, $5-7 \times 10^{17}$ cm$^{-3}$, 1.4 μm) are laminated in this sequence, for example, by a liquid phase epitaxy method (LPE method).

To prevent an occurrence of crystalline disorder of the semiconductor multilayer film 8 to be formed later, it is desirable to perform setting in a manner that the height H of the buried part A, that is, the height from the surface of the cladding layer 2 to the surface of the cap layer 5, and the height h of the burying part B, that is, the sum of the thicknesses of the blocking layers 6 and 7 are nearly the same or the difference between them is within 0.5 μm, that is, a relation of $|H-h| \leq 0.5$ μm holds.

A semiconductor multilayer film 8 the conductivity type of which is p-type to act as a reflecting mirror is formed covering the surfaces of the buried part A and the burying part B, and a contact layer 9 made of GaAs shaped in a rectangular of 100 μm length for holding ohmic contact is formed on the central portion of the surface of this semiconductor multilayer film 8 corresponding to the buried part A. A p-side electrode 10 consisting of Au/Zn/Au or Au/Cr is formed in a predetermined thickness on the surface of the semiconductor multilayer film 8 including the surface of the contact layer 9, and a current is injected into the buried part A through the p-side electrode 10 and the contact layer 9 as shown by an arrow.

On the other hand, a projection window 1a for laser beam penetrating the semiconductor substrate 1 is opened by etching on the portion comprising the buried part A on the other surface (top surface in FIG. 1) of the semiconductor substrate 1. A dielectric multilayer film 11 to act as a reflecting mirror is formed on the surface of the cladding layer 2 exposed to the inner part of the projection window 1a, and a n-side electrode 12 consisting of Au/Sn is formed on the other surface of the remaining semiconductor substrate 1.

A heat sink (not illustrated in the drawing) is installed in the state stuck to the p-side electrode 10, and heat generated in the buried part A being the main heat source is conducted to the heat sink while diffusing into the semiconductor multilayer film 8 through the cap layer 5, the blocking layers 6 and 7, being discharged.

Next, description is made on configurations of the semiconductor multilayer film 8 and the dielectric multilayer film 11 which act as reflecting mirrors.

In designing the semiconductor multilayer film 8 and the dielectric multilayer film 11, the Bragg wavelength showing the reflecting characteristic thereof is matched with a longitudinal mode one mode higher than the longitudinal mode of oscillation in pulse operation to increase the reflection factor. This means that the oscillation wavelength of GaAs in pulse operation is 882 nm, but in continuous operation accompanied by heat generation, the oscillation spectrum is shifted to the longer wavelength side due to the generated heat, and therefore considering this shift, the Bragg wavelength of the semiconductor multilayer film 8 and the dielectric multilayer film 11 is set to 892.4 nm.

To realize such a Bragg wavelength, the semiconductor multilayer film 8 is constituted by laminating $Ga_{0.9}Al_{0.1}As$ layer/$Ga_{0.4}Al_{0.6}As$ layer alternately 25 times, and the thickness of a pair of the both layers is 133.1 nm ($Ga_{0.9}Al_{0.1}As$ layer: 634 Å, $Ga_{0.4}Al_{0.6}As$ layer: 697 Å). Also, the heat conductivities of the $Ga_{0.9}Al_{0.1}As$ layer and the $Ga_{0.4}Al_{0.6}As$ layer constituting the semiconductor multilayer film 8 are about 0.19 w/cm/deg, 0.11 w/cm/deg respectively, and the heat resistance of the device using this is about 150° C./W. Obviously, this excels in the heat discharging characteristic by about two times or more in comparison with the case of using the dielectric film made of such as $SiO_2$ or $TiO_2$ (heat resistance: 400° C./W). The semiconductor multilayer film 8 having such a configuration is fabricated by using the OMVPE method, and an example of conditions for fabrication in this case is shown below.

Temperature of Substrate: 800° C.
Material Gases: TMGa, TMAl, $AsH_3$, DEZn

| | V/III Ratio | Rate of Growth (Å/sec) | Carrier Density (cm$^{-3}$) |
|---|---|---|---|
| $Ga_{0.9}Al_{0.1}As$ layer | 120 | 5 | $3.5-4.0 \times 10^{18}$ |
| $Ga_{0.4}Al_{0.6}As$ layer | 120 | 5 | $3.5-4.0 \times 10^{18}$ |

Also, to realize the Bragg wavelength as described above, the dielectric multilayer film 11 is constituted by laminating a $SiO_2$ layer and a $TiO_2$ layer alternately four times, and the thickness of a pair of the both layers is 242.0 nm ($SiO_2$ layer: 1528 Å, $TiO_2$ layer: 892 Å). The dielectric multilayer film 11 having such a configuration is fabricated using the EB evaporation method, and an example of conditions for fabrication in this case is shown below., Temperature of Substrate: 250° C.
Rate of Growth:
5 Å/sec ($SiO_2$ layer)
2 Å/sec ($TiO_2$ layer)

Next, description is made on the reason of setting the layer thickness of each layer constituting such two reflecting mirrors (multilayer film).

First, the reflection factor $R^2$ of the reflecting mirror is determined. Taking the refractive indexes of the both layers constituting the multilayer film as $n_1$ and $n_2$, the number of pairs thereof as m, and the refractive index of the substrate whereon the multilayer film is formed as $n_s$ (note that the refractive index of the substrate-side layer is $n_2$), the reflection factor $R^2$ of the reflecting mirror (multilayer film) is given by the following Equation (1).

$$R^2 = \left[ \frac{n_s(-n_2/n_1)^m - (-n_1/n_2)^m}{n_s(-n_2/n_1)^m + (-n_1/n_2)^m} \right]^2 \quad (1)$$

Substituting the refractive indexes $n_1$ ($Ga_{0.4}Al_{0.6}As$) = 3.20 and $n_2$ ($Ga_{0.9}Al_{0.1}As$) = 3.52 of the semiconductor multilayer film 8, the refractive index $n_s$ = 3.34 of the cladding layer 4 being the substrate and the number of pairs m = 25 of the semiconductor multilayer film 8 into the above Equation (1), $R^2$ = 0.990 is obtained.

Also, substituting the refractive indexes $n_1$($TiO_2$) = 2.50 and $n_2$($SiO_2$) = 1.46 of the dielectric multilayer film 11, the refractive index $n_s$ = 3.34 of the cladding layer 2 being the substrate and the number of pairs m = 4 of the dielectric multilayer film 11 into the above-mentioned Equation (1), $R^2$ = 0.984 is obtained.

In addition, to obtain desired reflection factors of the semiconductor multilayer film 8 and the dielectric multilayer film 11, the number m of the pair constituting them has only to be set.

Next, description is made on contribution of such a reflecting mirror to the resonator length, that is, calculation of the effective resonator length $L_{eff}$.

The following Equation (2) holds for the Bragg wavelength of the reflecting mirror.

$$R^2 = \tan h(KL_{eff}) \quad (2)$$

$R^2$: Reflection Factor
K:
  $\pi(\Delta n)/\lambda_0$: Coupling Coefficient
  $\lambda_0 = 882$ nm: Oscillation Wavelength
  $\Delta n = |n_2 - n_1|$: Difference in Refractive Index Between Both Layers From the above-mentioned Equation (2), $L_{eff}$ is expressed by the following Equation (3).

$$L_{eff} = \frac{\tanh^{-1}(R^2)}{\frac{\pi(\Delta n)}{\lambda_0}} \quad (3)$$

$L_{eff}$ is calculated for the semiconductor multilayer film 8. Since $\Delta n = 3.52 - 3.20 = 0.32$ and $R^2 = 0.990$, $L_{eff} = 2.63$ μm is obtained.

For the dielectric multilayer film 11, $\Delta n = 2.5 - 1.46 = 1.04$ and $R^2 = 0.984$, and therefore $L_{eff} = 0.74$ μm is obtained.

Accordingly, a total of effective resonator length $L_{eff}$ by the both multilayer films are given by the following Equation (4).

$$L_{eff} = 2.63 + 0.74 = 3.37 \mu m \quad (4)$$

Next, the wavelength one mode higher than that of pulse oscillation is calculated. The axial mode interval $\Delta\lambda$ is calculated by the following Equation (5).

$$\Delta\lambda = -\lambda_0^2/2 \cdot n_{eff} \cdot L \quad (5)$$

$\lambda_0 = 882$ nm,
$n_{eff} = 4$: Effective Refractive Index
L=1 (Interval Between Both Multilayer Films 6 μm) + $L_{eff}$(3.37 μm) = 9.37 μm Accordingly, $\Delta\lambda = 10.4$ nm is obtained, and the wavelength λ one mode higher is given by the following Equation (6).

$$\lambda = \lambda_0 + \Delta\lambda = 882\mu m + 10.4 nm = 892.4 nm \quad (6)$$

Next, the layer thickness of each layer constituting the both multilayer films is determined. Taking the refractive index of each layer as n, the layer thickness d of each layer has only to be set to $d = \lambda/4n$ by the diffraction condition of Bragg. Specific calculation of the layer thickness d of each layer constituting the semiconductor multilayer film 8 and the dielectric multilayer film 11 results as follows.

Semiconductor Multilayer Film 8:
  $Ga_{0.9}Al_{0.1}As$ (n=3.52), d=634 Å
  $Ga_{0.4}Al_{0.6}As$ (n=3.20), d=697 Å
Dielectric Multilayer Film 11:
  $SiO_2$ (n=1.46), d=1528 Å
  $TiO_2$ (n=2.50), d=892 Å

Accordingly, by setting the layer thickness of each layer constituting the semiconductor multilayer film 8 and the dielectric multilayer film 11 to the values as mentioned above, a stable laser oscillation is made possible in the longitudinal mode one mode higher than the mode in pulse operation.

In addition, substantially a similar configuration can be adopted also in the case where the conductivity types p and n of the above-described embodiment is reversed. In this case, for the semiconductor multilayer film the conductivity type of which is n-type which is used as a reflecting mirror, a configuration is adopted wherein 25 pairs of $Ga_{0.9}Al_{0.1}As/AlAs$ layers are formed.

Figure 2:
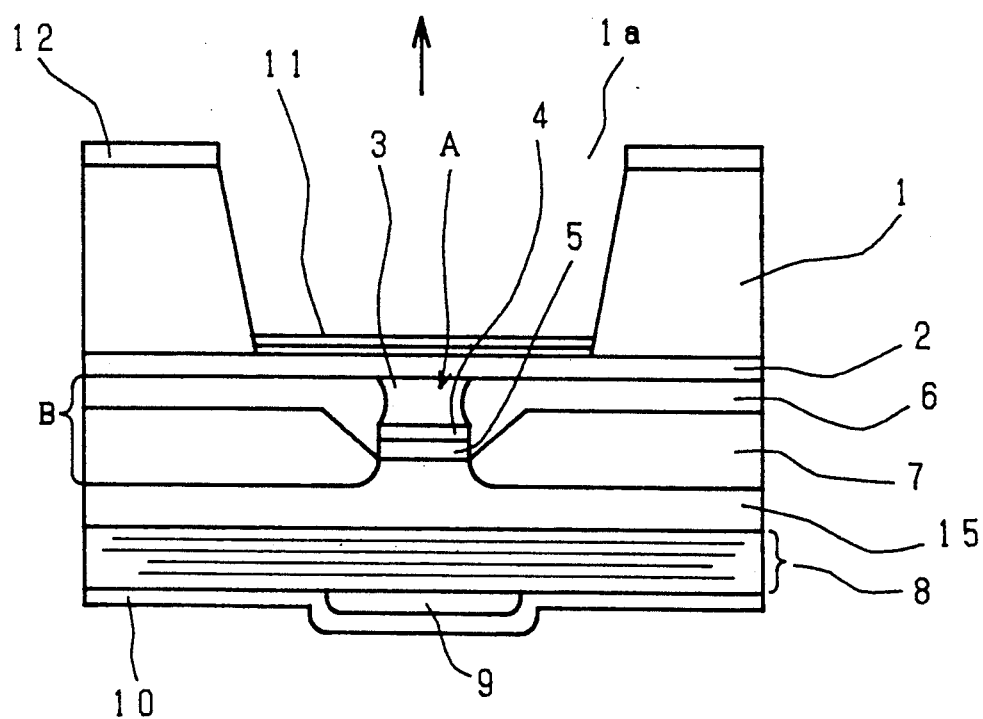
FIG. 2 is a cross-sectional structure view of another embodiment of the surface-emitting-type semiconductor laser device of the present invention.

FIG. 2 is a cross-sectional structure view showing another embodiment of the present invention, and in this embodiment, a buffer layer 15 is formed in a required thickness on the surfaces of the buried part A and the burying part B using $Ga_{1-z}Al_zAs$ ($z \geq 0$), and a semiconductor multilayer film 8 similar to that of the embodiment as shown in FIG. 1 is formed on the buffer layer 15. Thereby, the surface is made uniform, and further the conditions for growing the burying part B are alleviated, and the stability and uniformity of the characteristics of the semiconductor multilayer film 8 can be easily obtained.

Other configurations are substantially the same as those of the embodiment as shown in FIG. 1, and description thereon is omitted by designating the corresponding portions by the same numbers.

In such an embodiment, by forming the buffer layer 15 covering the buried part A and the burying part B, the uniformity of the surfaces thereof can be secured, and a crystalline disorder due to a disorder of growth conditions can be prevented in forming the semiconductor multilayer film 8, and further the mutual bonding force is improved.

Figure 3:
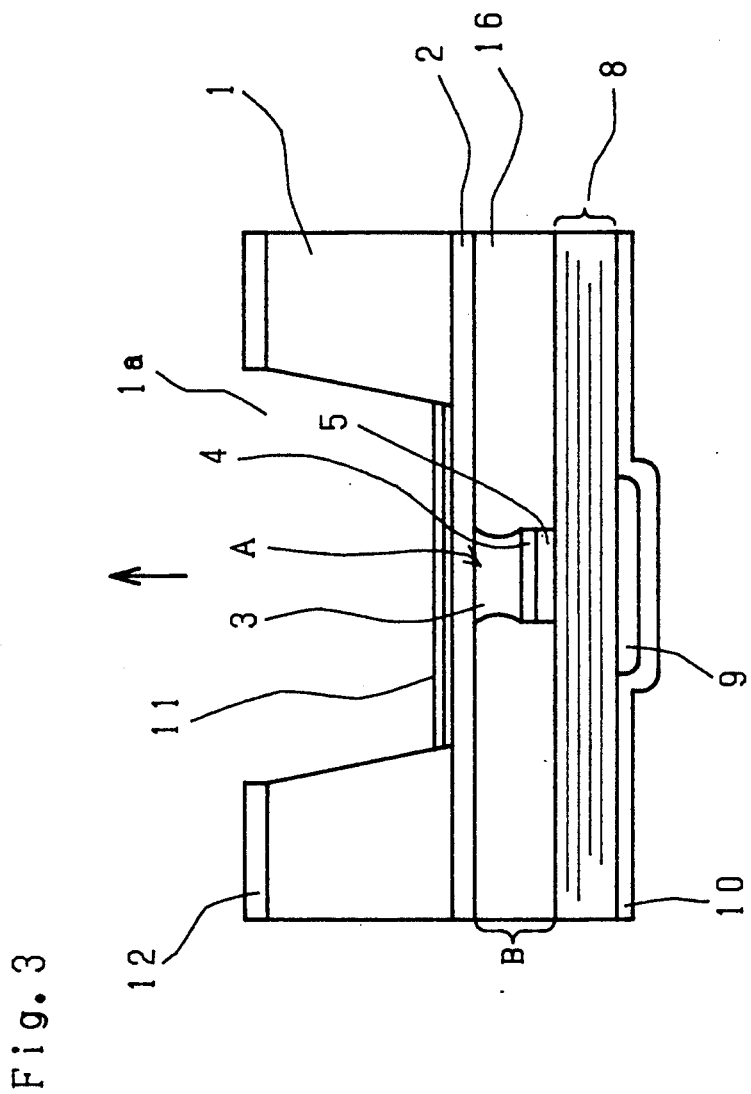
FIG. 3 is a cross-sectional structure view of still another embodiment of the surface-emitting-type semiconductor laser device of the present invention.

FIG. 3 is a cross-sectional view showing still another embodiment of the present invention, wherein the burying part B constituted by using a high-resistance layer 16 such as non-doped AlAs. In addition, an insulating layer may be used in place of the high-resistance layer 16. Other configurations are substantially the same as those of the embodiment as shown in FIG. 1, and description thereon is omitted by designating the corresponding portions by the same numbers.

In addition, the present invention is applicable also to the III, V group series or the II, VI group series, for example, the GaInAsP/InP system.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A surface-emitting-type semiconductor laser apparatus, comprising:
  a substrate;
  a buried part comprising an active region;
  a burying part for blocking current and which is formed around said buried part;
  a first reflecting mirror consisting of a conductive semiconductor multilayer film and which is installed on said buried part and said burying part;
  a second reflecting mirror formed opposite said first reflecting mirror with said active region sandwiched between said first and second reflecting mirrors, said burying part being sandwiched between said substrate and semiconductor multilayer film, said first and second reflecting mirrors cooperating with each other to have a Bragg wavelength, which is indicative of a reflecting characteristic of said mirrors, set to match a longitudinal mode one mode higher than the longitudinal mode of oscillation in pulse operation;

a first electrode which is formed on a surface of said semiconductor multilayer film that faces away from said active region; and a second electrode which is formed on said substrate, said substrate being sandwiched between said second electrode and said burying part.

2. An apparatus as in claim 1, wherein said semiconductor multilayer film has a configuration wherein two kinds of GaAlAs layers having different composition ratios of Al are laminated alternately plural times.

3. An apparatus as in claim 1, wherein said second reflecting mirror consists of a dielectric multilayer film wherein two kinds of dielectric layers are laminated alternately plural times.

4. An apparatus as in claim 3, wherein the Bragg wavelength of said dielectric multilayer film is set in matching with a longitudinal mode one mode higher than the longitudinal mode of oscillation in pulse operation.

5. An apparatus as in claim 1, wherein, taking the height of said buried part as H and the height of said burying part as h, the following expression is met:

$$|H-h| \geq 0.5 \mu m$$

6. An apparatus as in claim 1, further comprising a buffer layer which is installed between said buried part and said burying part, and said semiconductor multilayer film and is for adjusting the heights of said buried part and said burying part.

7. An apparatus as in claim 1, wherein said burying part is constituted by a high-resistance crystal layer.

8. An apparatus as in claim 1, wherein said buried part and said burying part are made of GaAlAs/GaAs system.

9. An apparatus as in claim 1, wherein said buried part and said burying part are made of GaInAsP/InP system.

10. An apparatus as in claim 1, further comprising a cladding layer between said substrate and said burying part as well as between said second reflecting mirror and said active region.

11. An apparatus as in claim 10, wherein said substrate is ring-shaped so as to have an inner face which defines a space, said second reflecting mirror extending in said space and being on said cladding layer.

12. An apparatus as in claim 11, wherein said burying part extends radially outside of said active region.

13. An apparatus as in claim 1, further comprising a contact layer sandwiched between a portion of said second electrode and a portion of said semiconductor multilayer film.

14. An apparatus as in claim 1, wherein said burying part is constituted by an insulating crystal layer.

15. An apparatus as in claim 10, wherein said substrate and said cladding layer are of one conductivity type, said buried part further comprising another cladding layer and a cap layer, said another cladding layer being sandwiched between said active region and said cap layer, all of said buried part being of another conductivity type different from that of said one conductivity type, said multilayer film being of said another conductivity type, said second reflective mirror consisting of a dielectric multilayer film.

16. An apparatus as in claim 15, wherein said burying part has a first blocking layer of said another conductivity type and a second blocking layer of said one conductivity type, said second blocking layer being sandwiched between said first blocking layer and said multilayer film of said first reflective mirror.

17. An apparatus as in claim 15, wherein said substrate is ring-shaped with an inner face which defines a space, said second reflecting mirror being in said space.

18. An apparatus as in claim 16, further comprising a buffer layer sandwiched between said first reflective mirror and said second blocking layer as well as between said first reflective mirror and said cap layer.

19. An apparatus as in claim 16, wherein said burying part is constituted by an insulating crystal layer.

20. An apparatus as in claim 10, wherein said second reflecting mirror abuts against said substrate.

* * * * *

UNITED STATES PATENT AND TRADEMARK OFFICE
CERTIFICATE OF CORRECTION

PATENT NO. : 5,020,066

DATED : May 28, 1991

INVENTOR(S) : KENICHI IGA et al.

It is certified that error appears in the above-identified patent and that said Letters Patent is hereby corrected as shown below:

In the title page, at the "Assignees:" portion, delete "Sanyo Electric Electric Co., Ltd.," and substitute therefor --Sanyo Electric Co. Ltd.,--.

Signed and Sealed this

Fifth Day of January, 1993

Attest:

DOUGLAS B. COMER

*Attesting Officer*     *Acting Commissioner of Patents and Trademarks*